United States Patent
Tsou

(10) Patent No.: US 9,397,263 B2
(45) Date of Patent: Jul. 19, 2016

(54) LIGHT-EMITTING DIODES

(71) Applicant: LEXTAR ELECTRONICS CORPORATION, Hsinchu (TW)

(72) Inventor: Po-Hung Tsou, New Taipei (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 14/207,373

(22) Filed: Mar. 12, 2014

(65) Prior Publication Data

US 2015/0076445 A1   Mar. 19, 2015

(30) Foreign Application Priority Data

Sep. 17, 2013 (TW) .............................. 102133587 A

(51) Int. Cl.
| | |
|---|---|
| H01L 29/06 | (2006.01) |
| H01L 31/00 | (2006.01) |
| H01L 33/00 | (2010.01) |
| H01L 29/15 | (2006.01) |
| H01L 31/0256 | (2006.01) |
| H01L 33/38 | (2010.01) |
| H01L 33/42 | (2010.01) |

(52) U.S. Cl.
CPC .............. *H01L 33/38* (2013.01); *H01L 33/385* (2013.01); *H01L 33/42* (2013.01); *H01L 2933/0016* (2013.01)

(58) Field of Classification Search
USPC .......................................................... 257/13
See application file for complete search history.

(56) References Cited

U.S. PATENT DOCUMENTS

| | | | | |
|---|---|---|---|---|
| 6,445,007 | B1 * | 9/2002 | Wu ........................ | H01L 33/385 257/80 |
| 6,650,018 | B1 * | 11/2003 | Zhao ....................... | H01L 33/38 257/749 |
| 7,282,741 | B2 * | 10/2007 | Kim et al. ........................ | 257/79 |
| 7,968,902 | B2 * | 6/2011 | Lowery ............................ | 257/99 |
| 8,319,233 | B2 * | 11/2012 | Beom et al. ..................... | 257/88 |
| 9,006,768 | B2 * | 4/2015 | Pan ..................... | H01L 33/0079 257/98 |
| 9,070,833 | B2 * | 6/2015 | Chuang ................. | H01L 33/145 |
| 2008/0185606 | A1 * | 8/2008 | Sano ....................... | H01L 33/42 257/98 |
| 2009/0194779 | A1 * | 8/2009 | Yoon .............................. | 257/98 |
| 2010/0163907 | A1 * | 7/2010 | Hsu ...................... | H01L 33/385 257/98 |
| 2010/0210046 | A1 * | 8/2010 | Kao ............................... | 438/26 |
| 2011/0095265 | A1 * | 4/2011 | Sakamoto et al. ............. | 257/13 |
| 2011/0114990 | A1 * | 5/2011 | Kim ....................... | H01L 33/38 257/99 |
| 2011/0156086 | A1 * | 6/2011 | Kim ....................... | H01L 33/38 257/99 |
| 2011/0163346 | A1 * | 7/2011 | Seo et al. ........................ | 257/99 |
| 2012/0032139 | A1 * | 2/2012 | Kimura et al. .................. | 257/13 |

(Continued)

FOREIGN PATENT DOCUMENTS

WO    WO2012130115    * 10/2012

*Primary Examiner* — Jarrett Stark
*Assistant Examiner* — Charles N Ausar-El

(57) ABSTRACT

A light-emitting diode is provided. The light-emitting diode includes an N-type semiconductor layer, a light-emitting layer and a P-type semiconductor layer. A P-type electrode includes a body part and an extension part, wherein the body part is disposed on a corner of an upper surface of the P-type semiconductor layer and the extension part extends from the body part onto the N-type semiconductor layer along a sidewall of the P-type semiconductor layer adjacent to the N-type semiconductor layer. An N-type electrode is disposed on the N-type semiconductor layer. Moreover, a current blocking layer is disposed under the P-type electrode. A transparent conductive layer is disposed on a partial upper surface of the P-type semiconductor layer.

14 Claims, 3 Drawing Sheets

(56) References Cited

U.S. PATENT DOCUMENTS

| | | | |
|---|---|---|---|
| 2012/0043566 A1* | 2/2012 | Wu et al. | 257/94 |
| 2013/0049051 A1* | 2/2013 | Wang et al. | 257/98 |
| 2013/0134867 A1* | 5/2013 | Yang | H01L 33/38 313/499 |
| 2013/0234192 A1* | 9/2013 | Kim | H01L 33/0008 257/98 |
| 2013/0341591 A1* | 12/2013 | Chen | 257/13 |
| 2014/0091351 A1* | 4/2014 | Tsai | 257/99 |
| 2014/0138615 A1* | 5/2014 | Shen et al. | 257/13 |
| 2015/0236216 A1* | 8/2015 | Kim | H01L 33/46 257/98 |

* cited by examiner

LIGHT-EMITTING DIODES

CROSS REFERENCE TO RELATED APPLICATIONS

This Application claims priority of Taiwan Patent Application No. 102133587, filed on Sep. 17, 2013, the entirety of which is incorporated by reference herein.

BACKGROUND OF THE INVENTION

1. Field of the Invention

The invention relates to light-emitting diodes and more particularly to a location of an electrode of light-emitting diodes.

2. Description of the Related Art

A light-emitting diode (LED) is a semiconductor electronic component which can provide illumination. The light-emitting diode includes a p-doped semiconductor layer and an n-doped semiconductor layer. When the light-emitting diode is switched on, electrons are able to recombine with holes at the interface between the p-doped semiconductor layer and the n-doped semiconductor layer, releasing energy in the form of photons. This effect is called the electroluminescence of the light-emitting diode. Light-emitting diodes have many advantages over conventional incandescent light bulbs, including lower energy consumption, a longer lifespan, smaller size, high brightness, etc. Thus, light-emitting diodes are widely used in applications such as various electronic devices and general lighting.

Generally, a P-type electrode and an N-type electrode are respectively formed on the p-doped semiconductor layer and the n-doped semiconductor layer of the light-emitting diode. Moreover, in order to ensure the even distribution of current, the P-type electrode and the N-type electrode of the light-emitting diode further include a current expansion strip. In conventional light-emitting diodes, the current expansion strip of the P-type electrode is usually disposed on the p-doped semiconductor layer. The current expansion strip of the P-type electrode of conventional light-emitting diodes covers a part of a light-emitting area of the light-emitting diodes. The light-emitting area of the light-emitting diodes is thereby decreased and the luminous efficiency of the conventional light-emitting diodes is also reduced.

BRIEF SUMMARY OF THE INVENTION

The disclosure provides an improvement in disposition of electrodes of light-emitting diodes. A current expansion strip of a P-type electrode of the light-emitting diodes is disposed in an area of an N-type semiconductor layer not overlapping with a P-type semiconductor layer. Thus, the current expansion strip of the P-type electrode does not cover a light-emitting area of the light-emitting diodes. The ratio of the light-emitting area of the light-emitting diodes covered by the P-type electrode is thereby reduced and the luminous efficiency of the light-emitting diodes is further enhanced. At the same time, the advantage of the current expansion strip of the P-type electrode remains, ensuring the even distribution of current.

In embodiments of the disclosure, a light-emitting diode is provided. The light-emitting diode includes an N-type semiconductor layer. A light-emitting layer is disposed on a portion of the N-type semiconductor layer to expose another portion of the N-type semiconductor layer. A P-type semiconductor layer is disposed on the light-emitting layer. A P-type electrode includes a first body part and a first extension part, wherein the first body part is disposed on a corner of an upper surface of the P-type semiconductor layer and the first extension part extends from the first body part onto the exposed portion of the N-type semiconductor layer along a sidewall of the P-type semiconductor layer adjacent to the exposed portion of the N-type semiconductor layer. An N-type electrode is disposed on the exposed portion of the N-type semiconductor layer. The light-emitting diode further includes a current blocking layer disposed on a part of the P-type semiconductor layer under the P-type electrode and on a part of the N-type semiconductor layer under the P-type electrode. Furthermore, a transparent conductive layer is disposed on a partial upper surface of the P-type semiconductor layer, and a part of the transparent conductive layer is disposed between the current blocking layer and the P-type electrode.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
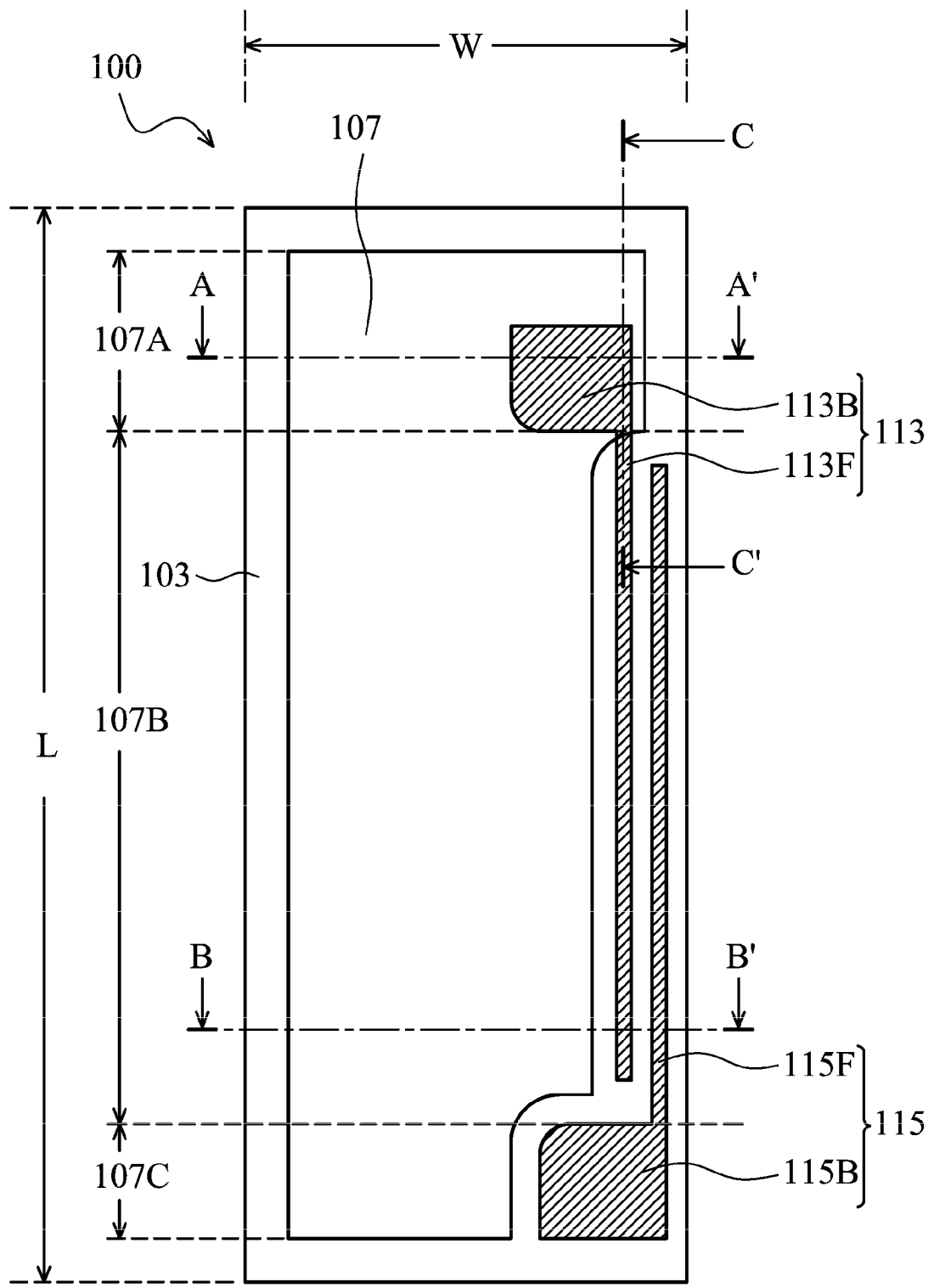
FIG. 1 shows a schematic plane view of a light-emitting diode according to an embodiment of the disclosure.

Referring to FIG. 1, a plane view of a light-emitting diode 100 according to an embodiment of the disclosure is shown. In order to simplify the drawing, some element layers of the light-emitting diode 100 are not shown in FIG. 1, such as a substrate, a light-emitting layer, a current blocking layer, a transparent conductive layer, etc. For the disposition of these element layers, refer to cross sections of the light-emitting diode 100 as shown in the subsequent FIGS. 2-4. The light-emitting diode 100 includes an N-type semiconductor layer 103. A light-emitting layer (not shown) is disposed on a first portion of the N-type semiconductor layer 103 and a second portion of the N-type semiconductor layer 103 is thereby exposed. A P-type semiconductor layer 107 is disposed on the light-emitting layer and over the N-type semiconductor layer 103, such that the second portion of the N-type semiconductor layer 103 is also exposed.

Moreover, the light-emitting diode 100 further includes a P-type electrode 113 and an N-type electrode 115. In an embodiment, the P-type electrode 113 and the N-type electrode 115 can be made of metal materials. The P-type electrode 113 includes a first body part 113B and a first extension part 113F. The first body part 113B is a major pad of the P-type electrode 113. The first extension part 113F is a current expansion finger of the P-type electrode 113. As shown in FIG. 1, from a top view, the shapes of the N-type semiconductor layer 103 and the P-type semiconductor layer 107 are roughly rectangular. The rectangular N-type semiconductor layer 103 has a first side L and a second side W, wherein the first side L has a length greater than that of the second side W. The first extension part 113F of the P-type electrode 113 extends along the direction of the first side L. Thus, the first extension part 113F of the P-type electrode 113 can make current spread along the direction of the first side L. Further, current can be distributed evenly on the P-type semiconductor layer 107 through the transparent conductive layer (not shown) under the P-type electrode 113.

As shown in FIG. 1, the first body part 113B of the P-type electrode 113 is disposed on a corner of the upper surface of the P-type semiconductor layer 107. The first extension part 113F of the P-type electrode 113 extends from the first body part 113B onto the exposed N-type semiconductor layer 103 along a sidewall of the P-type semiconductor layer 107 adjacent to the exposed N-type semiconductor layer 103. In addition, the N-type electrode 115 also includes a second body part 115B and a second extension part 115F. The second body part 115B is a major pad of the N-type electrode 115. The second extension part 115F is a current expansion finger of the N-type electrode 115. The second extension part 115F of the N-type electrode 115 and the first extension part 113F of the P-type electrode 113 are parallel to each other.

According to an embodiment of the disclosure, the first extension part 113F of the P-type electrode 113, the second body part 115B and the second extension part 115F of the N-type electrode 115 are disposed on the exposed N-type semiconductor layer 103. The second body part 115B of the N-type electrode 115 is disposed on a corner of the exposed N-type semiconductor layer 103. The second extension part 115F of the N-type electrode 115 extends along the direction of the first side L of the rectangular N-type semiconductor layer 103 to make current spread along the direction of the first side L. Therefore, current is distributed evenly on the N-type semiconductor layer 103.

As shown in FIG. 1, the upper surface of the P-type semiconductor layer 107 can be defined into a first area 107A, a second area 107B and a third area 107C. The first area 107A corresponds to the first body part 113B of the P-type electrode 113. The second area 107B corresponds to the first extension part 113F of the P-type electrode 113 and the second extension part 115F of the N-type electrode 115. The third area 107C corresponds to the second body part 115B of the N-type electrode 115. Moreover, as shown in FIG. 1, from a top view, compared with a portion of a longer side of the P-type semiconductor layer 107 corresponding to the first area 107A, a portion of the longer side of the P-type semiconductor layer 107 corresponding to the second area 107B is bent toward the center of the P-type semiconductor layer 107. Moreover, compared with the portion of the longer side corresponding to the second area 107B, a portion of the longer side corresponding to the third area 107C is also bent toward the center of the P-type semiconductor layer 107.

According to an embodiment of the disclosure, the first extension part 113F of the P-type electrode 113 is not disposed over an area of the N-type semiconductor layer 103 of the light-emitting diode 100 overlapped with the P-type semiconductor layer 107. In other words, the first extension part 113F of the P-type electrode 113 is not disposed over a light-emitting area of the light-emitting diode 100. Therefore, the light-emitting area of the light-emitting diode 100 of the disclosure is not shielded by the first extension part 113F of the P-type electrode 113. A light-shielding area of the P-type electrode 113 is thereby reduced. The light-emitting area of the light-emitting diode 100 is not reduced by the disposition of the first extension part 113F of the P-type electrode 113. The luminous efficiency of the light-emitting diode 100 is further enhanced. At the same time, the first extension part 113F of the P-type electrode 113 remains and can be referred to as a current-spreading finger.

In an embodiment, an overlapping area between the N-type semiconductor layer 103 and the P-type semiconductor layer 107 of the light-emitting diode 100 is, for example, 162800 $\mu m^2$. The first body part 113B of the P-type electrode 113 has an area of 6100 $\mu m^2$. The first extension part 113F of the P-type electrode 113 has an area of 2400 $\mu m^2$. Compared with an example of the P-type electrode 113 completely disposed on the P-type semiconductor layer 107, the first extension part 113F of the P-type electrode 113 is not disposed over the light-emitting area of the light-emitting diode 100 in the embodiment of the disclosure. Thus, a ratio of the light-shielding area of the P-type electrode 113 to the light-emitting area can be reduced from 5.2% to 3.7% by the embodiment. The light extraction efficiency of the light-emitting diode 100 is thereby enhanced effectively.

Figure 2:
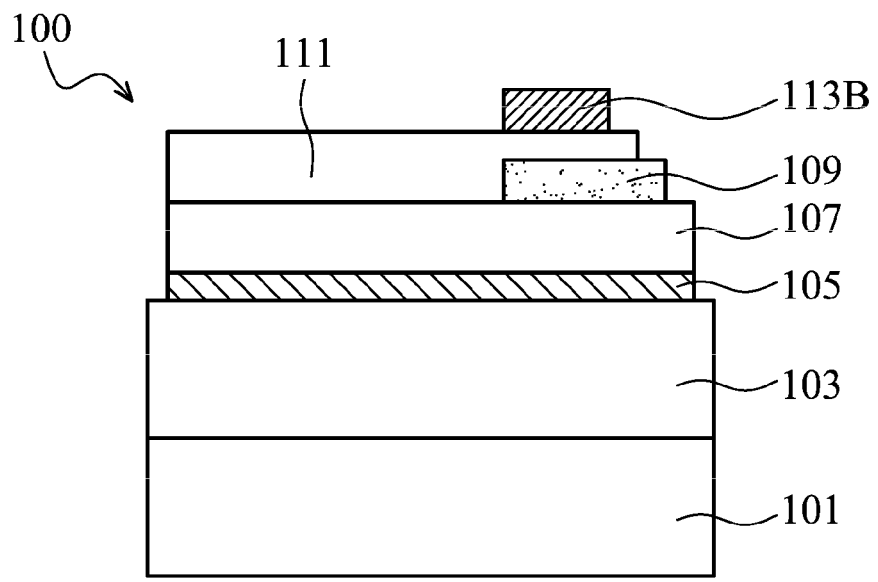
FIG. 2 shows a schematic cross section of a light-emitting diode along the cross section line A-A' of FIG. 1 according to an embodiment of the disclosure.

Referring to FIG. 2, a schematic cross section of the light-emitting diode 100 along the cross section line A-A' of FIG. 1 according to an embodiment of the disclosure is shown. The N-type semiconductor layer 103 is disposed on a substrate 101. A light-emitting layer 105 is disposed on a portion of the N-type semiconductor layer 103 to expose another portion of the N-type semiconductor layer 103. The P-type semiconductor layer 107 is disposed on the light-emitting layer 105. The light-emitting layer 105 and the P-type semiconductor layer 107 can be formed by a photolithography and etching process for fabricating a mesa structure of the light-emitting diode 100.

Figure 3:
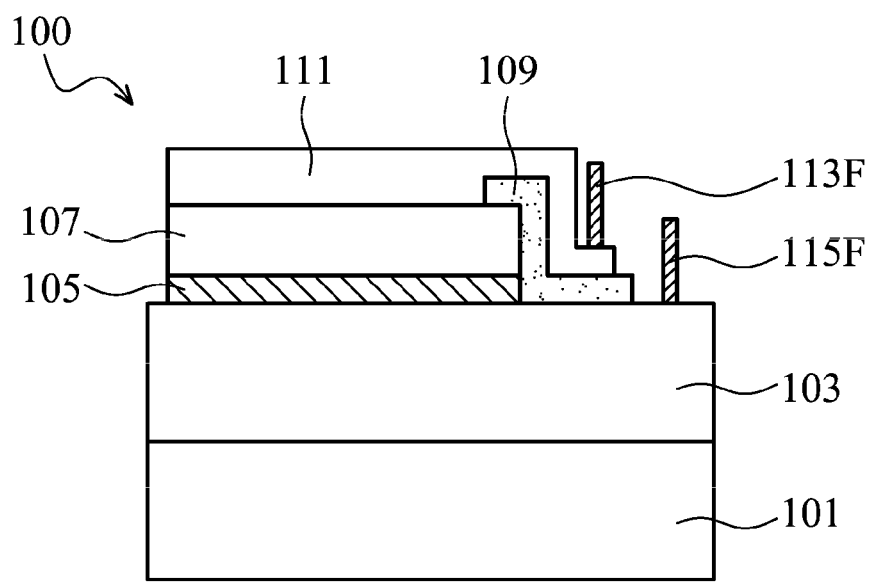
FIG. 3 shows a schematic cross section of a light-emitting diode along the cross section line B-B' of FIG. 1 according to an embodiment of the disclosure.
Figure 4:
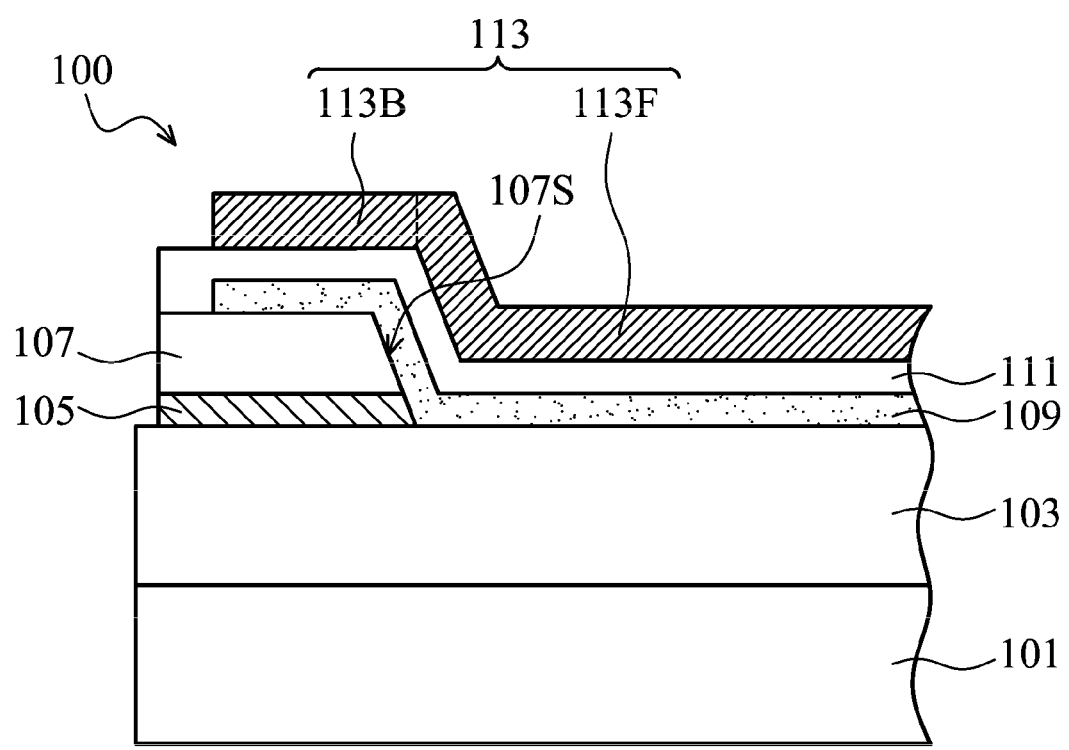
FIG. 4 shows a schematic cross section of a light-emitting diode along the cross section line C-C' of FIG. 1 according to an embodiment of the disclosure.

In an embodiment, the light-emitting diode 100 is for example a blue light-emitting diode. In which, the substrate 101 can be a sapphire substrate. The material of the N-type semiconductor layer 103 can be an N-type nitride containing gallium, for example N-type gallium nitride (N-GaN). The material of the P-type semiconductor layer 107 can be a P-type nitride containing gallium, for example P-type gallium nitride (P-GaN). The light-emitting layer 105 can be a semiconductor layer having a multiple quantum well (MQW) structure. The material of the light-emitting layer 105 is for example InGaN and GaN. In other embodiments, the substrate 101, the N-type semiconductor layer 103, the P-type semiconductor layer 107 and the light-emitting layer 105 of the light-emitting diode 100 can be formed of other suitable materials. Thus, light-emitting diodes with lighting of various colors are obtained. Moreover, the light-emitting diode 100 can further include other element layers, such as a buffer layer disposed between the substrate 101 and the N-type semiconductor layer 103. The structures of FIGS. 2-4 are shown for simplifying the specification. However, the structures of the light-emitting diode 100 are not limited to the structures of FIGS. 2-4.

Referring to FIG. 3, a schematic cross section of the light-emitting diode 100 along the cross section line B-B' of FIG. 1 according to an embodiment of the disclosure is shown. As shown in FIG. 2 and FIG. 3, the light-emitting diode 100 further includes a current blocking layer 109 corresponding to and disposed under the P-type electrode 113. The current blocking layer 109 is disposed on a portion of the P-type semiconductor layer 107 under the first body part 113B of the P-type electrode 113, and on a portion of the N-type semiconductor layer 103 under the first extension part 113F of the P-type electrode 113.

In addition, as shown in FIG. 3, the current blocking layer 109 is further disposed on a sidewall of the P-type semiconductor layer 107 adjacent to the exposed N-type semiconductor layer 103. The current blocking layer 109 extends from the upper surface of the P-type semiconductor layer 107 along the sidewall onto the exposed N-type semiconductor layer 103. The current blocking layer 109 can be formed by a photolithography and etching process. Moreover, because the current blocking layer 109 covers the sidewall of the P-type semiconductor layer 107 adjacent to the exposed N-type semiconductor layer 103, the current blocking layer 109 can also be used as a protection layer for a junction of the P-type semiconductor layer 107 and the N-type semiconductor layer 103, i.e. a P/N-junction passivation layer. In an embodiment, the material of the current blocking layer 109 can be an organic or an inorganic insulating material, for example silicon dioxide.

As shown in FIG. 2 and FIG. 3, the light-emitting diode 100 further includes a transparent conductive layer 111 disposed on a partial upper surface of the P-type semiconductor layer 107. A portion of the transparent conductive layer 111 is disposed between the current blocking layer 109 and the P-type electrode 113. As shown in FIG. 2, a portion of the transparent conductive layer 111 is disposed between the current blocking layer 109 and the first body part 113B of the P-type electrode 113. As shown in FIG. 3, a portion of the transparent conductive layer 111 is disposed between the current blocking layer 109 and the first extension part 113F of the P-type electrode 113. Moreover, a portion of the transparent conductive layer 111 is conformally formed on the current blocking layer 109 and covers the sidewall of the P-type semiconductor layer 107 adjacent to the exposed N-type semiconductor layer 103. The transparent conductive layer 111 can be formed by a photolithography and etching process.

The transparent conductive layer 111 can be used as a current-spreading layer to ensure that a current applied to the P-type electrode 113 is spread evenly to the P-type semiconductor layer 107. It can prevent current from crowding, and a high voltage is thereby avoided. In an embodiment, the material of the transparent conductive layer 111 can be indium tin oxide or another suitable transparent conductive material. After the transparent conductive layer 111 is formed, the P-type electrode 113 and the N-type electrode 115 are formed on the transparent conductive layer 111 and the exposed N-type semiconductor layer 103 to complete the fabrication of the light-emitting diode 100.

Referring to FIG. 4, a schematic cross section of the light-emitting diode 100 along the cross section line C-C' of FIG. 1 according to an embodiment of the disclosure is shown. The first extension part 113F of the P-type electrode 113 extends from the first body part 113B along a sidewall 107S of the P-type semiconductor layer 107 adjacent to the exposed N-type semiconductor layer 103 onto the exposed N-type semiconductor layer 103. In an embodiment, the sidewall 107S is slanted. The slanted sidewall 107S can help the first extension part 113F of the P-type electrode 113 more easily extend from the first body part 113B along the sidewall 107S onto the exposed N-type semiconductor layer 103.

Moreover, as shown in FIG. 4, the current-blocking layer 109 and the transparent conductive layer 111 are disposed between the P-type electrode 113 and the P-type semiconductor layer 107 and between the P-type electrode 113 and the exposed N-type semiconductor layer 103. In the same way, the slanted sidewall 107S can also help the current blocking layer 109 and the transparent conductive layer 111 more easily extend from the upper surface of the P-type semiconductor layer 107 along the sidewall 107S onto the exposed N-type semiconductor layer 103.

According to the embodiments of the disclosure, by disposing the first extension part 113F of the P-type electrode 113 above the exposed N-type semiconductor layer 103, the light-emitting area of the light-emitting diode 100 is not shielded by the first extension part 113F of the P-type electrode 113. Thus, a ratio of the light-emitting area of the light-emitting diode 100 shielded by the P-type electrode 113 is reduced and the luminous efficiency of the light-emitting diodes is further enhanced effectively. At the same time, the first extension part 113F of the P-type electrode 113 remains and is referred to as a current-spreading finger. Therefore, the embodiments of the disclosure are more suitable for rectangular light-emitting diodes 100 having a longer side such as the first side L and another shorter side as the second side W.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light-emitting diode, comprising:
an N-type semiconductor layer;
a light-emitting layer disposed on a portion of the N-type semiconductor layer to expose another portion of the N-type semiconductor layer;
a P-type semiconductor layer disposed on the light-emitting layer;
a P-type electrode including a first body part and a first extension part, wherein the first body part is disposed on a corner of an upper surface of the P-type semiconductor layer and the first extension part extends from the first body part onto the exposed portion of the N-type semiconductor layer along a sidewall of the P-type semiconductor layer adjacent to the exposed portion of the N-type semiconductor layer;
an N-type electrode disposed on the exposed portion of the N-type semiconductor layer;
a current blocking layer disposed on a part of the P-type semiconductor layer under the P-type electrode and on a part of N-type semiconductor layer under the P-type electrode; and
a transparent conductive layer disposed on a partial upper surface of the P-type semiconductor layer, and a part of the transparent conductive layer disposed between the current blocking layer and the P-type electrode.

2. The light-emitting diode as claimed in claim 1, wherein the first extension part of the P-type electrode is not disposed over an area of the N-type semiconductor layer overlapping with the P-type semiconductor layer.

3. The light-emitting diode as claimed in claim 1, wherein the sidewall of the P-type semiconductor layer adjacent to the exposed portion of the N-type semiconductor layer is slanted.

4. The light-emitting diode as claimed in claim 3, wherein the first extension part of the P-type electrode is not disposed over an area of the N-type semiconductor layer overlapping with the P-type semiconductor layer.

5. The light-emitting diode as claimed in claim 3, wherein the N-type semiconductor layer has a shape of a rectangle, a first side of the rectangle is longer than a second side of the rectangle, and the first extension part of the P-type electrode is extending along the direction of the first side.

6. The light-emitting diode as claimed in claim 5, wherein the first extension part of the P-type electrode is not disposed over an area of the N-type semiconductor layer overlapping with the P-type semiconductor layer.

7. The light-emitting diode as claimed in claim 5, wherein the N-type electrode includes a second body part and a second extension part, and the second extension part of the N-type electrode and the first extension part of the P-type electrode are parallel to each other.

8. The light-emitting diode as claimed in claim 7, wherein the first extension part of the P-type electrode is not disposed over an area of the N-type semiconductor layer overlapping with the P-type semiconductor layer.

9. The light-emitting diode as claimed in claim 7, wherein the upper surface of the P-type semiconductor layer is defined into a first area, a second area and a third area, the first area corresponds to the first body part of the P-type electrode, the second area corresponds to the first extension part of the P-type electrode and the second extension part of the N-type electrode, and the third area corresponds to the second body part of the N-type electrode.

10. The light-emitting diode as claimed in claim 9, wherein the first extension part of the P-type electrode is not disposed over an area of the N-type semiconductor layer overlapping with the P-type semiconductor layer.

11. The light-emitting diode as claimed in claim 1, further comprising a substrate, wherein the N-type semiconductor layer is disposed on the substrate.

12. The light-emitting diode as claimed in claim 11, wherein the N-type semiconductor layer is a nitride containing gallium.

13. The light-emitting diode as claimed in claim 11, wherein the P-type semiconductor layer is a nitride containing gallium.

14. The light-emitting diode as claimed in claim 11, wherein the light-emitting layer is a semiconductor layer with a multiple quantum well structure.

* * * * *